(12) United States Patent
He

(10) Patent No.: US 11,680,698 B2
(45) Date of Patent: Jun. 20, 2023

(54) LAMP BEAD SUPPORT WITH OPENING BETWEEN ELECTRICAL CONTACTS AND LIGHT FIXTURE HAVING THE SAME

(71) Applicant: Chongyi Jingyi Lighting Products Co., Ltd, Ganzhou (CN)

(72) Inventor: Yaoquan He, Ganzhou (CN)

(73) Assignee: CHONGYI JINGYI LIGHTING PRODUCTS CO., LTD, Ganzhou (CN)

( * ) Notice: Subject to any disclaimer, the term of this patent is extended or adjusted under 35 U.S.C. 154(b) by 0 days.

(21) Appl. No.: 17/540,733

(22) Filed: Dec. 2, 2021

(65) Prior Publication Data
US 2022/0235921 A1 Jul. 28, 2022

(30) Foreign Application Priority Data

Jan. 25, 2021 (CN) .......................... 202110097609.5

(51) Int. Cl.
*F21V 23/00* (2015.01)
*F21V 19/00* (2006.01)

(52) U.S. Cl.
CPC ........ *F21V 19/0025* (2013.01); *F21V 23/002* (2013.01)

(58) Field of Classification Search
CPC .............. F21V 19/001; F21V 19/0015; F21V 19/0025; F21V 23/002; F21V 21/002; F21S 4/10–28
See application file for complete search history.

(56) References Cited

U.S. PATENT DOCUMENTS

| | | | |
|---|---|---|---|
| 11,215,349 B1 * | 1/2022 | Wu ........................ | F21V 23/005 |
| 11,239,393 B1 * | 2/2022 | Huang .................. | H01L 33/486 |
| 2007/0295975 A1 * | 12/2007 | Omae .................... | H05B 45/40 |
| | | | 257/89 |
| 2008/0298063 A1 | 12/2008 | Hayashi | |
| 2009/0230413 A1 * | 9/2009 | Kobayakawa ........ | H01L 33/502 |
| | | | 438/26 |
| 2010/0270580 A1 * | 10/2010 | Posselt .................... | H01L 33/62 |
| | | | 257/E33.059 |
| 2014/0353701 A1 | 12/2014 | Abdul Karim et al. | |
| 2016/0218248 A1 * | 7/2016 | Möllmer ............. | H01L 21/4817 |

FOREIGN PATENT DOCUMENTS

CN 111933780 A 11/2020

OTHER PUBLICATIONS

Chinese Priority Document CN 2021200566077, filed Jan. 11, 2021 to Huang (Year: 2021).*
Machine Translation of Chinese Priority Document CN 2021200566077, retrieved Feb. 3, 2022 (Year: 2022).*
Dictionary definition of Parallelepiped, retrieved from merriam-webster.com on Dec. 19, 2022 (Year: 2022).*
Office Action for EP application No. 21208526.0 dated May 20, 2022.

* cited by examiner

*Primary Examiner* — Keith G. Delahoussaye
*Assistant Examiner* — Steven Y Horikoshi
(74) *Attorney, Agent, or Firm* — Billion & Armitage

(57) ABSTRACT

The present application relates to a lamp bead support and a light fixture, wherein the lamp bead support comprises a frame body and a first circuit board which is connected with the frame body; the first circuit board comprises a first weld portion and a second weld portion which extend out of the frame body; and the first weld portion and the second weld portion form a snipping opening at the outside of the frame body.

20 Claims, 4 Drawing Sheets

LAMP BEAD SUPPORT WITH OPENING BETWEEN ELECTRICAL CONTACTS AND LIGHT FIXTURE HAVING THE SAME

CROSS-REFERENCES TO RELATED APPLICATIONS

This application claims the benefit of the Chinese Patent Application 202110097609.5, entitled "Lamp bead support and light fixture", and filed on Jan. 25, 2021, the entire contents of which are incorporated herein by reference.

TECHNICAL FIELD

The present application relates to the technical field of illuminative decoration, and specifically to a lamp bead support and a light fixture.

BACKGROUND ART

Typically, there are 4 welding pins at the bottom of a point-control lamp bead support, including an anode, a cathode, a signal input, a signal output, wherein in order that the lamp beads can work properly, there shall be no connection between the signal input and signal output, thus the two must be spaced apart and the wire rod shall be snipped.

However, when wire rod snipping process is performed on existing lamp bead supports, it has following disadvantages: it is not convenient to snip the copper wire between the signal input and signal output.

SUMMARY

The present application provides a lamp bead support and a light fixture, which facilitate the snipping of signal wires, such as copper wires, between the signal input and signal output, facilitating consequently production of light strings.

Some embodiments of this application disclose a lamp bead support, comprising: a frame body, a first circuit board which is connected with the frame body;

the first circuit board can comprise a first weld portion and a second weld portion, the first weld portion and the second weld portion can extend out of the frame body; and the first weld portion and the second weld portion can form a snipping opening at the outside of the frame body.

In the embodiments of this application, by making the first weld portion and the second weld portion extend out of the frame body and providing the snipping opening between the second weld portion and the first weld portion, it is possible to snip the copper wire(s) between the first weld portion and the second weld portion without being obstructed by the frame body, facilitating consequently the cutting of the copper wire(s) between the first weld portion and the second weld portion.

As an optional embodiment, the first weld portion can be spaced apart from the second weld portion at the outside of the frame body, forming consequently the snipping opening.

As an optional embodiment, the snipping opening can be formed as an open section opening to an outside direction of periphery of the lamp bead support.

In this optional embodiment, by forming the snipping opening as an open section opening to an outside direction of periphery of the lamp bead support, the signal input wire and the signal output wire can be cut off by extending the cutting edge from the peripheral outside of the frame body into the snipping opening.

As an optional embodiment, the frame body, the first weld portion and the second weld portion can be formed as a one-piece component.

As an optional embodiment, the frame body, the first weld portion and the second weld portion can be formed as a one-piece component through overmolding.

In this optional embodiment, the lamp bead support can be mass produced at a lower cost.

As an optional embodiment, the frame body can be formed separately from the first weld portion and the second weld portion, and the first weld portion and the second weld portion can be attached to the frame body, so that the distal end of the first weld portion and the distal end of the second weld portion extend beyond the end of the frame body, and that the parts of the first weld portion and the second weld portion extending beyond the end of the frame body are spaced apart at the outside of the frame body, forming consequently the snipping opening.

As an optional embodiment, the first weld portion can be equipped with a first pin, which can be electrically connected to the signal input wire.

In this optional embodiment, the first circuit board can be electrically connected to the signal input wire through the first pin.

As an optional embodiment, the second weld portion can be equipped with a second pin, which can be electrically connected to the signal output wire.

In this optional embodiment, the first circuit board can be electrically connected to the signal output wire through the second pin.

As an optional embodiment, the first weld portion and the second weld portion can extend beyond the bottom edge of the frame body and form the snipping opening at the outside of the bottom edge.

In this optional embodiment, the snipping opening formed by the first weld portion and the second portion can be provided at the outside of the frame body's bottom edge, so that the cutting edge can extend from the outside of the bottom edge of the frame body into the snipping opening so as to snip the signal wires, which can facilitate the cutting of the signal wires between the first weld portion and the second weld portion.

As an optional embodiment, the lamp bead support can further comprise a second circuit board, which is connected to the frame body, and of which an end can extend beyond the top edge of the frame body; and the second circuit board can be electrically connected to an anode wire.

In this optional embodiment, an electrical connection to the anode wire can be achieved through the second circuit board.

As an optional embodiment, the lamp bead support can further comprise a third circuit board, which can be connected to the frame body; and the third circuit board can be electrically connected to a cathode wire.

In this optional embodiment, an electrical connection to the cathode wire can be achieved through the third circuit board.

As an optional embodiment, the third circuit board can be installed between the first circuit board and the second circuit board, and there can be a first gap between the third circuit board and the second circuit board.

In this optional embodiment, the first gap can facilitate the dispersion of lamp light, improving consequently the lighting effect.

As an optional embodiment, there can be a second gap between the third circuit board and the first circuit board.

In this optional embodiment, the lighting effect can be further improved through the second gap.

As an optional embodiment, the frame body can be rectangular.

In this optional embodiment, by setting the frame body as rectangular, it can facilitate the stringing of a plurality of lamp bead supports to produce a light string.

Some embodiments of this application disclose a light fixture, comprising the lamp bead supports as described in the preceding embodiments and lamp beads mounted in the lamp bead support.

The lamp provided by embodiments of this application can feature a better convenience of wire snipping.

Additional features and advantages of this application will be described in detail in the subsequent specific embodiments.

BRIEF DESCRIPTION OF DRAWINGS

In order to illustrate the technical solution of this application's embodiments, the drawings which are necessary to be used in embodiments shall be briefly introduced, it should be appreciated that the following drawings only show some certain embodiments of this application and thus should not be regarded as limiting in scope, and that for a skilled person in the art, other related drawings may be obtained from these drawings without inventive effort.

Figure 1:
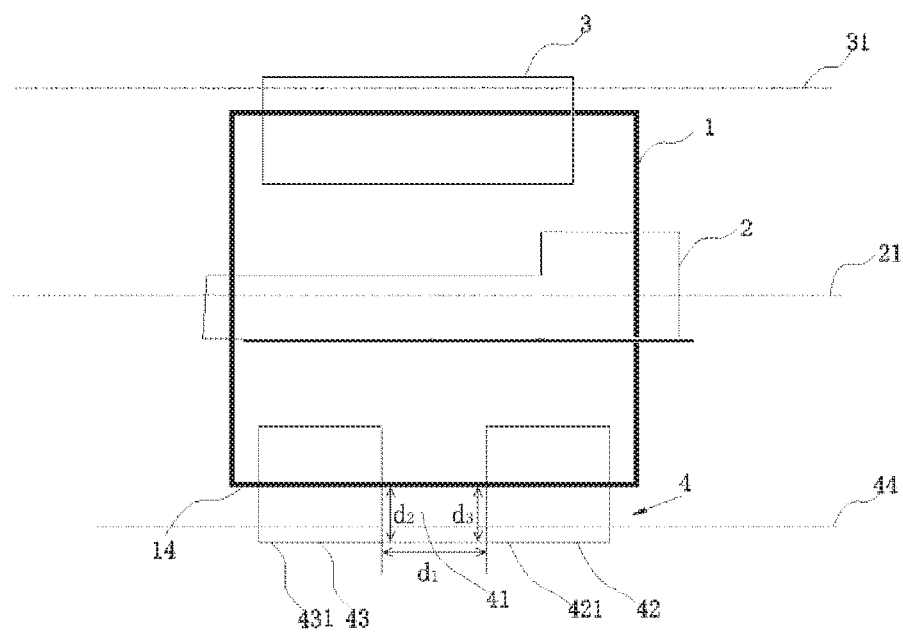
FIG. 1 is a schematic structure diagram of a lamp bead support provided according to an embodiment of this application.
Figure 2:
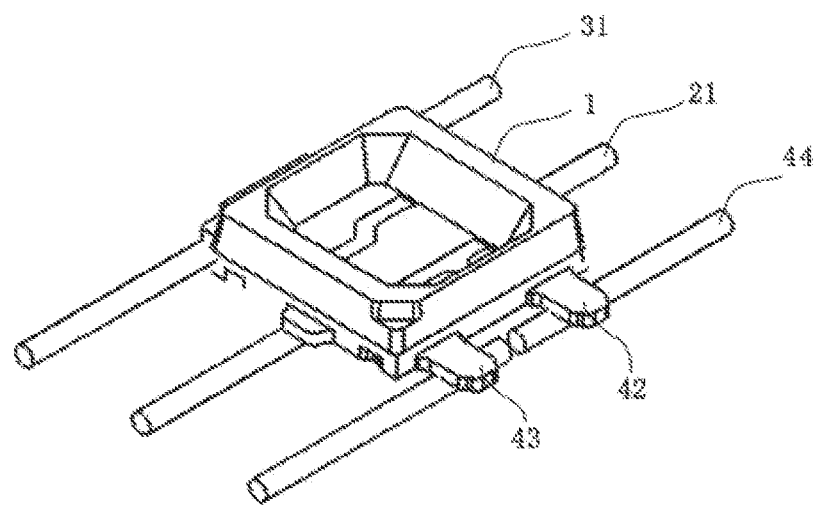
FIG. 2 is a schematic perspective view of the lamp bead support provided according to the embodiment of this application.

Reference numeral list: frame body 1, third circuit board 2, cathode wire 21, second circuit board 3, anode wire 31, first circuit board 4, snipping opening 41, second weld portion 42, first weld portion 43, signal wire 44, related-art frame body 5, related-art anode wire 51, related-art signal wire 52, related-art cathode wire 53, related-art circuit board 6, lamp bead support 7, encapsulating glue 8, controller 9, power supply 10.

DETAILED DESCRIPTION OF EMBODIMENTS

In order to clarify the purpose, technical solutions and advantages of embodiments of the present application, the technical solutions in the embodiments of this application will be described clearly and completely below in combination with the drawings in the embodiments of this application. Evidently, the described embodiments are a part of the embodiments of this application instead of the entire embodiments. Typically, the components of the embodiments of this application described and shown in the drawings herein can be arranged and designed in various different configurations.

In description of this application, it should be noted that the orientation or positional relations indicated by terms such as "in" and "out" are orientation or positional relations based on the drawings, or orientation or positional relations in which the product of this application is conventionally placed in use, which merely intends to facilitate the description of this application and to simplify the description, rather than indicating or implicating that the referred device or element must have a certain orientation, and be constructed and operated in the certain orientation, thus cannot be construed as a limit of the present application. Moreover, terms such as "first", "second" etc. are merely used for distinguishing the description and cannot be construed as an indication or implication of importance in relativity.

In description of this application, it should additionally be noted that unless otherwise specified and defined, terms such as "provide" and "connect" should be understood in a broad sense, for example, it may be a fixed connection, a detachable connection, or an integral connection; it may be direct connection or indirect connection through an intermediate medium, or it can be internal communication between two elements. For a skilled person in the art, the specific meaning of foregoing terms in this application can be understood in accordance with specific circumstances.

Figure 3:
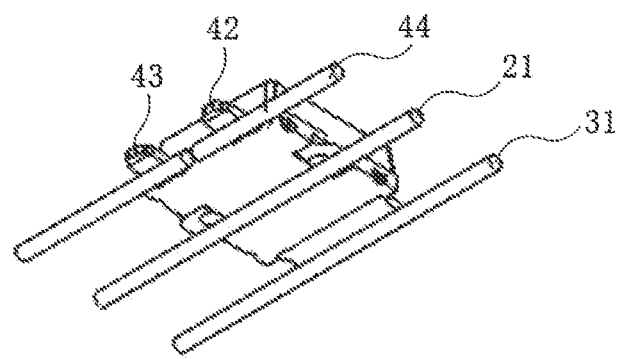
FIG. 3 is a schematic bottom perspective view of the lamp bead support provided according to the embodiment of this application.
Figure 4:
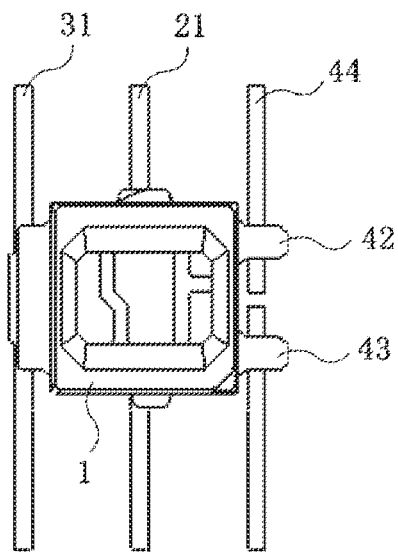
FIG. 4 is a schematic top view of a lamp bead support provided according to the embodiment of this application.

Firstly, the lamp bead support provided according to the embodiments of this application will be described in detail with reference to FIG. 1 to FIG. 4. As shown in FIG. 1 and FIG. 3, embodiments of this application disclose a lamp bead support, which comprises: a frame body 1 and a first circuit board 4, wherein the first circuit board 4 is connected to the frame body 1, and wherein the first circuit board is electrically connected to a signal wire 44. The signal wire 44 can be a copper wire in some embodiments.

The first circuit board 4 comprises a first weld portion 43 and a second weld portion 42, and the first weld portion 43 and the second weld portion 42 extend out of the frame body 1; and the first weld portion 43 and the second weld portion 42 form a snipping opening 41 on the outside of the frame body 1.

It should be pointed out that the first weld portion 43 and the second weld portion 42 extending out of the frame body 1 means that: a distal end 431 of the first weld portion 43 and a distal end 421 of the second weld portion 42 are provided to be spaced apart from an end 14 of the frame body 1 in a direction away from the frame body 1, when the lamp bead support is viewed from above. In this way, the snipping opening 41 can be formed by making the first weld portion 43 spaced apart from the second weld portion 42 at the outside of the frame body 1. In some embodiments, the snipping opening 41 can be formed as an open section opening to an outside direction of periphery of the lamp bead support.

It could be understood that the shape and size of the snipping opening 41 can be set according to practical working conditions and are not limited in the present application, as long as it allows the signal wire 44 to be cut in the snipping opening 41 without being obstructed by the frame body 1. In other words, without departing from the spirit and scope of this application, a skilled person in the art can set the distance d1 from the first weld portion 43 to the second weld portion 42, the distance d2 from the distal end 431 of the first weld portion 43 to the end 14 of the frame body 1, and the distance d3 from the distal end 421 of the second weld portion 42 to the end 14 of the frame body 1.

In the embodiments of this application, by making the first weld portion 43 and the second weld portion 42 extend out of the frame body 1 and providing the snipping opening 41 between the second weld portion 42 and the first weld portion 43, it enables that the signal wire(s) such as copper wire(s) between the first weld portion 43 and the second weld portion 42 are cut without being obstructed by the frame body 1, facilitating consequently the cutting of the copper wire(s) between the first weld portion 43 and the second weld portion 42 and then production of light strings.

Optionally, in some embodiments of this application, the lamp bead support can be integrally formed through overmolding, thereby making the frame body 1, the first weld portion 43 and the second weld portion 42 formed as a one-piece component. In this way, the lamp bead support can be mass produced at a lower cost.

However, it shall be understood that the way of forming the lamp bead support of this application is not limited to this. Without departing from the spirit and scope of this application, the frame body 1 of the lamp bead support can also be formed separately from the first weld portion 43 and the second weld portion 42. For example, the frame body 1 formed as e.g. a metal sheet can be installed at first, and then the first weld portion 43 and the second weld portion 42 can be attached to the frame body 1, so that the distal end 431 of the first weld portion 43 and the distal end 421 of the second weld portion 42 extend beyond the end 14 of the frame body 1, and that the parts of the first weld portion 43 and the second weld portion 42 extending beyond the distal end 14 of the frame body 1 are spaced apart at the outside of the frame body 1, forming consequently the snipping opening 41. It should be pointed out that the way of attaching the first weld portion 43 and the second weld portion 42 to the frame body 1 is not limited in this application, as long as the first weld portion 43 and the second weld portion 42 can be made to extend out of the frame body 1 and to form the snipping opening 41 at the outside of the frame body 1. For example, the first weld portion 43 and the second weld portion 42 can be attached to the frame body 1 in various appropriate means such as welding, bonding, threaded connection, etc.

Figure 5:
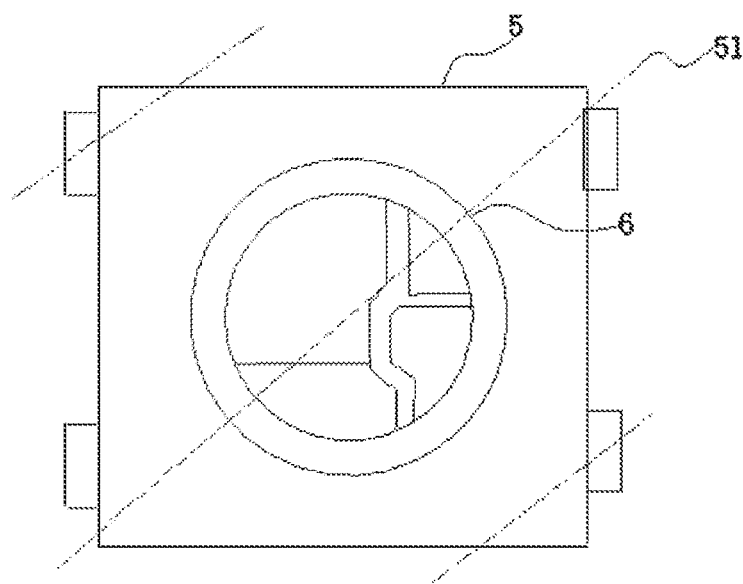
FIG. 5 is a schematic structure diagram of a lamp bead support in related technologies.

Subsequently, the advantages of the lamp bead support provided according to the embodiment of this application will be more specifically demonstrated in combination with description of the lamp bead support provided according to related technologies in FIG. 5. FIG. 5 is a schematic structure diagram of a lamp bead support in related technologies. It should be pointed out that the following description is not limiting, i.e., the advantages of the lamp bead support of this application is not limited to the following description.

As shown in FIG. 5, the lamp bead support provided according to related technologies comprises a frame body 5 and a circuit board 6, wherein the circuit board 6 neither extends out of the frame body 5 nor is provided with a snipping opening, as thus it is hard to cut the copper wire of the signal wire 51 between the signal input pin and the signal output pin. For example, the copper wire can be cut only from above the circuit board 6 by a cutting tool, and again for example, it is prone to damage the circuit board by cutting the copper wire from above the circuit board 6 due to proximity of the copper wire to the circuit board.

And in contrast, referring back to FIG. 1 to FIG. 4, FIG. 1 to FIG. 4 are schematic diagrams of the lamp bead support provided according to the embodiments of this application. As shown in FIG. 1 to FIG. 4, the lamp bead support provided according to embodiments of this application can get free of being obstructed by the frame body 1 due to provision of the snipping opening 41, which facilitates consequently cutting the copper wire.

In the embodiments of this application, as an optional embodiment, the first weld portion 43 is equipped with a first pin, which is electrically connected to the signal output wire.

In this optional embodiment, the first circuit board 4 can be electrically connected to the signal input wire through the first pin.

In the embodiments of this application, as an optional embodiment, the second weld portion 42 is equipped with a second pin, which is electrically connected to the signal output wire.

In this optional embodiment, the first circuit board 4 can be electrically connected to the signal output wire through the second pin.

In the embodiments of this application, the continuous wire rod forming the signal wire 44 can be first attached at the outside of the frame body 1 to the first weld portion 43 and the second portion 42, and then be cut by operating in the snipping opening 41. In some embodiments, after the continuous wire rod as the signal wire 44 being attached to the first weld portion 43 and the second portion 42, the cutting edge can extend into the snipping opening 41 from the peripheral outside of the lamp bead support so as to cut the continuous wire rod. In this way, the signal wire 44 can be easily cut into the signal input wire attached to the first weld portion 43 and the signal output wire attached to the second weld portion 42.

According to the embodiments of this application, since the cutting edge can extend into the snipping opening 41 from the peripheral outside of the lamp bead support without any obstruction, the signal input wire and the output wire can thus be easily and rapidly cut off, without touching the first weld portion 43, the second weld portion 42 and the frame body 1, which avoids damage to the circuit board 4 of the lamp bead support during cutting of the signal wire.

In the embodiments of this application, as an optional embodiment, the first weld portion 43 and the second weld portion 42 extend beyond the bottom edge of the frame body 1 and form the snipping opening 41 on the outside of the bottom edge. It could be appreciated that the bottom edge can be the end 14 of the frame body 1.

In this optional embodiment, the snipping opening 41 formed by the first weld portion 43 and the second portion 42 can be provided at the outside of the bottom edge of the frame body 1, so that the cutting edge can extend into the snipping opening 41 from the outside of the bottom edge of the frame body 1 so as to cut the signal wire 44 off, which can facilitate cutting the signal wire 44 between the first weld portion 43 and the second weld portion 42.

In the embodiments of this application, as an optional embodiment, the lamp bead support comprises further a second circuit board 3, and the second circuit board 3 is connected to the frame body 1, and an end of the second circuit board 3 extends beyond the top edge of the frame body 1; it could be appreciated that the top edge of the frame body 1 is opposite to the bottom edge of the frame body 1.

The second circuit board 3 is electrically connected to an anode wire 31.

In this optional embodiment, an electrical connection to the anode wire may be achieved through the second circuit board 3.

In the embodiments of this application, as an optional embodiment, the lamp bead support comprises further a third circuit board 2, and the third circuit board 2 is connected to the frame body 1; and the third circuit board 2 is electrically connected to a cathode wire 21.

In this optional embodiment, an electrical connection to the cathode wire may be achieved through the third circuit board 2.

In the embodiments of this application, as an optional embodiment, the third circuit board 2 can be provided between the first circuit board 4 and the second circuit board 3, and there can be a first gap between the third circuit board 2 and the second circuit board 3. In other words, the second circuit board 3 and the third circuit board 2 are spaced apart by the first gap. In this way, the first gap can facilitate dispersion of lamp light and improve consequently the lighting effect.

In the embodiments of this application, as an optional embodiment, there is a second gap between the third circuit board 2 and the first circuit board 4. In other words, the third circuit board 2 and the first circuit board 4 can be spaced apart by the second gap. In this way, the lighting effect can be further improved through the second gap.

It should be noted that the third circuit board 2 can be electrically connected to the first circuit board 4 and the second circuit board 3 through electrical wires.

In the embodiments of this application, as an optional embodiment, the frame body 1 is rectangular.

In this optional embodiment, by setting the frame body 1 as rectangular, it can facilitate the stringing of a plurality of lamp bead supports to produce a light string.

It could be appreciated that the shape of the frame body 1 is not limited to this. The frame body 1 can be set as any appropriate shape without departing from the spirit and scope of this application, as long as it is able to achieve functions of the lamp bead support provided by this application.

Figure 6:
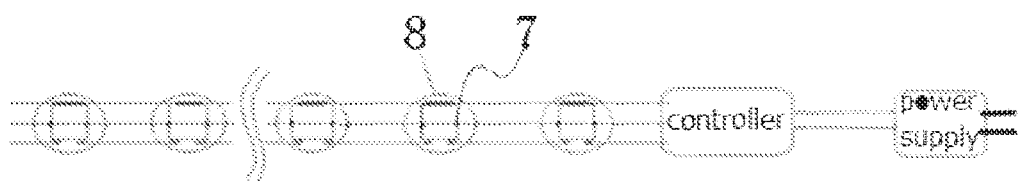
FIG. 6 is a schematic structure diagram of a light fixture provided according to embodiments of this application.

Moreover, the embodiments of this application disclose also a light fixture, comprising the lamp bead support(s) as in the embodiments of this application and lamp beads mounted in the lamp bead support(s). As shown in FIG. 6, the light fixture can by formed by serially connecting a plurality of lamp bead supports 7 and lamp beads mounted in the lamp bead supports, wherein each lamp bead support can be encapsulated with encapsulating glue 8 and each lamp bead support can be encapsulated with encapsulating glue. On the other hand, an end of the light fixture can be electrically connected to a controller 9 and a power supply 10, as thus it is possible to charge the light fixture through the power supply and control the light fixture through the controller.

The light fixture of the embodiments of this application has a better convenience for wire snipping.

It should be noted that the features in the embodiments in this application can be combined with each other without conflict.

The foregoing description represents merely preferred embodiments of this application and is not intended to limit this application, and the present application may have various changes and variations for a skilled person in the art. Any modifications, equivalent substitutions, improvements, etc. performed within the spirit and principles of this application shall be included in the scope of protection of this application.

INDUSTRIAL APPLICABILITY

The present application relates to a lamp bead support and a light fixture, wherein the lamp bead support comprises a frame body, and a first circuit board, which is connected with the frame body; the first circuit board comprises a first weld portion and a second weld portion which extend out of the frame body; and the first weld portion and the second weld portion form a snipping opening at the outside of the frame body. The present application has advantages that facilitate cutting-off of the copper wire between the signal input and signal output and production of light strings.

Moreover, it could be appreciated that the lamp bead support and light fixture of this application are reproducible and available in a plurality of industrial applications. For example, the lamp bead support and light fixture of this application can be used in any illuminative decoration technical field.

What is claimed is:

1. A lamp bead support, comprising:
a frame body;
a first circuit which is connected to the frame body, wherein the first circuit is provided with a first portion and a second portion, and the first portion and the second portion extend beyond the first circuit and the frame body from the same side surface of the first circuit and the frame body; and
a continuous wire rod forming a signal wire attached to the first portion and the second portion, wherein the first portion and the second portion form an opening therebetween through which the signal wire is cut, thereby forming an input portion of the signal wire and an output portion of the signal wire,
wherein the frame body has a first side surface perpendicular to a bottom surface, the first portion and the second portion extend beyond the first circuit and the frame body from the first side surface, the signal wire is provided on the first side surface of the frame body through the first portion and the second portion, and an extension direction of the first portion and the second portion is perpendicular to an extension direction of the signal line.

2. The lamp bead support according to claim 1, wherein the first portion and the second portion are spaced apart from each other outside of the first circuit, thereby forming the opening.

3. The lamp bead support according to claim 1, wherein the opening is formed as an open section opening to an outside direction of a periphery of the lamp bead support.

4. The lamp bead support according to claim 3, wherein the frame body, the first portion and the second portion are formed as a one-piece component.

5. The lamp bead support according to claim 4, wherein the frame body, the first portion and the second portion are formed as the one-piece component through overmolding.

6. The lamp bead support according to claim 1, wherein the frame body is formed separately from the first portion and the second portion, and the first portion and the second portion are attached to the frame body, so that a distal end of the first portion and a distal end of the second portion extend beyond an end of the frame body, and that parts of the first portion and the second portion extending beyond the end of the frame body are spaced apart from each other at the outside of the frame body, forming consequently the opening.

7. The lamp bead support according to claim 6, wherein the first portion is equipped with a first pin which is electrically connected to the input portion of the signal wire.

8. The lamp bead support according to claim 7, wherein the second portion is equipped with a second pin which is electrically connected to the output portion of the signal wire.

9. The lamp bead support according to claim 8, wherein the first portion and the second portion extend beyond a bottom edge of the frame body to form the opening at an outside of the bottom edge.

10. The lamp bead support according to claim 9, further comprising a second circuit which is connected to the frame body and an anode wire, and an end of the second circuit extends beyond a top edge of the frame body; and the second circuit is electrically connected to the anode wire.

11. The lamp bead support according to claim 10, further comprising a third circuit which is connected to the frame body and a cathode wire; and the third circuit is electrically connected to the cathode wire.

12. The lamp bead support according to claim 11, wherein the third circuit is provided between the first circuit and the second circuit, and a first gap is provided between the third circuit and the second circuit.

13. The lamp bead support according to claim 11, wherein a second gap is provided between the third circuit and the first circuit.

14. The lamp bead support according to claim 1, wherein the frame body is rectangular.

15. A lighting fixture, comprising at least one lamp bead support according to claim 1 and lamp beads mounted in the at least one lamp bead support.

16. The lamp bead support according to claim 1, wherein the frame body is formed separately from the first portion and the second portion, and the first portion and the second portion are attached to the frame body, so that a distal end of the first portion and a distal end of the second portion extend beyond an end of the frame body, and that parts of the first portion and the second portion extending beyond the end of the frame body are spaced apart from each other at the outside of the frame body, forming consequently the opening.

17. The lamp bead support according to claim 1, wherein the first portion is equipped with a first pin which is electrically connected to the input portion of the signal wire.

18. The lamp bead support according to claim 1, wherein the second portion is equipped with a second pin which is electrically connected to the output portion of the signal wire.

19. The lamp bead support according to claim 1, wherein the first portion and the second portion extend beyond a bottom edge of the frame body to form the opening at an outside of the bottom edge.

20. The lamp bead support according to claim 1, further comprising a second circuit which is connected to the frame body and an anode wire, and an end of the second circuit extends beyond a top edge of the frame body; and the second circuit is electrically connected to the anode wire.

* * * * *